(12) United States Patent
Motonishi et al.

(10) Patent No.: US 11,284,520 B2
(45) Date of Patent: Mar. 22, 2022

(54) INPUT DEVICE

(71) Applicant: Alps Alpine Co., Ltd., Tokyo (JP)

(72) Inventors: Michiharu Motonishi, Niigata-ken (JP); Kiyoshi Kobayashi, Niigata-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 390 days.

(21) Appl. No.: 16/675,657

(22) Filed: Nov. 6, 2019

(65) Prior Publication Data

US 2020/0073497 A1 Mar. 5, 2020

Related U.S. Application Data

(63) Continuation of application No. PCT/JP2018/019937, filed on May 24, 2018.

(30) Foreign Application Priority Data

Jun. 29, 2017 (JP) .............. JP2017-127174

(51) Int. Cl.
*G06F 3/041* (2006.01)
*G06F 3/044* (2006.01)
(Continued)

(52) U.S. Cl.
CPC ............. *H05K 3/361* (2013.01); *G06F 3/047* (2013.01); *G06F 3/04164* (2019.05);
(Continued)

(58) Field of Classification Search
CPC . G06F 3/36; G06F 3/041; G06F 3/044; G06F 3/046; G06F 3/0412; G06F 3/0443;
(Continued)

(56) References Cited

U.S. PATENT DOCUMENTS

2005/0046622 A1 3/2005 Nakanishi et al.
2008/0231789 A1* 9/2008 Kurasawa .......... G02F 1/13452
349/139
(Continued)

FOREIGN PATENT DOCUMENTS

JP 2011-81810 4/2011
JP 2011-118657 6/2011
(Continued)

OTHER PUBLICATIONS

International Search Report from International Application No. PCT/JP2018/019937 dated Jul. 3, 2018.
(Continued)

*Primary Examiner* — Xiaoliang Chen
(74) *Attorney, Agent, or Firm* — Beyer Law Group LLP

(57) ABSTRACT

An input device includes a sensor unit, an optical layer superimposed on the sensor unit, and a flexible wiring substrate having a connection region held between the optical layer and support base member. The flexible wiring substrate has a flexible base member on which an electrode layer is provided and a wiring end that is an end of the electrode layer and is conductive with the terminal part with a conductive joining member. The wiring end is set back from an end of the flexible base member, so that the flexible base member has a protruding part protruding toward the sensing region. Since the input device has, on the sensing region side relative to a front end of the protruding part, a part into which the conductive joining member does not stick out, an air bubble region between the sensor unit and the optical layer can be narrowed.

9 Claims, 10 Drawing Sheets

(51) Int. Cl.

| | |
|---|---|
| *G06F 3/046* | (2006.01) |
| *H01L 29/22* | (2006.01) |
| *H01L 29/786* | (2006.01) |
| *G02F 1/1333* | (2006.01) |
| *G02F 1/1334* | (2006.01) |
| *H05K 3/36* | (2006.01) |
| *G06F 3/047* | (2006.01) |
| *H05K 3/32* | (2006.01) |
| *H05K 1/11* | (2006.01) |
| *H05K 1/14* | (2006.01) |

(52) U.S. Cl.
CPC ............ *H05K 1/118* (2013.01); *H05K 1/147* (2013.01); *H05K 3/323* (2013.01); *G06F 3/0446* (2019.05); *G06F 2203/04102* (2013.01)

(58) Field of Classification Search
CPC ..... G06F 3/0446; H01L 29/22; H01L 29/786; H01L 29/7869; H01L 29/4908; H01L 29/66742; H01L 29/78696; G02F 1/1333; G02F 1/1334; G02F 1/1338; G02F 1/13452
USPC ........... 361/749; 345/87, 174, 205; 349/139; 257/43
See application file for complete search history.

(56) References Cited

U.S. PATENT DOCUMENTS

| | | |
|---|---|---|
| 2012/0228106 A1 | 9/2012 | Horino |
| 2013/0048978 A1* | 2/2013 | Watanabe ........... H01L 29/7869 257/43 |
| 2014/0001467 A1* | 1/2014 | Yamazaki ........... H01L 29/7869 257/43 |
| 2014/0152630 A1* | 6/2014 | Koyama ............... G06F 3/0412 345/205 |
| 2015/0277629 A1 | 10/2015 | Kao et al. |
| 2015/0331531 A1* | 11/2015 | Aoyama ............... G06F 3/0412 345/174 |
| 2016/0282989 A1* | 9/2016 | Hirakata ............... G06F 3/0443 |
| 2017/0012378 A1 | 1/2017 | Hassan-Ali et al. |

FOREIGN PATENT DOCUMENTS

| | | |
|---|---|---|
| JP | 2012-190087 | 10/2012 |
| JP | 2016-219049 | 12/2016 |
| JP | 2017-37509 | 2/2017 |
| TW | 201537427 | 10/2015 |

OTHER PUBLICATIONS

European Search Report from European Application No. 1882650 dated Feb. 25, 2021.

* cited by examiner

INPUT DEVICE

CLAIM OF PRIORITY

This application is a Continuation of International Application No. PCT/JP2018/019937 filed on May 24, 2018, which claims benefit of Japanese Patent Application No. 2017-127174 filed on Jun. 29, 2017. The entire contents of each application noted above are hereby incorporated by reference.

BACKGROUND OF THE INVENTION

1. Field of the Invention

The present invention relates to an input device. More specifically, the present invention relates to an input device including a touch sensor that detects a position of approach of a finger or the like.

2. Description of the Related Art

A touch panel often used as an input device includes a touch sensor that detects a position of approach (hereinafter, approach encompasses contact) of a finger or the like to a detection region. For example, a mutual capacitance touch panel is provided with a drive-side electrode and an output-side electrode. The drive-side electrode is given a drive pulse, and the output-side electrode detects a change in capacitance caused by approach of a finger or the like.

A surface panel for clear display of an image and protection from contact of a finger or the like is provided on a topmost surface of the touch panel. The touch sensor is disposed between the surface panel and a display device such as a liquid crystal display device and is attached to the surface panel and the display device with use of a light-transmitting resin such as an optical clear adhesive (OCA). Furthermore, an optical layer such as a polarizing film may be provided between the touch sensor and the surface panel.

Japanese Unexamined Patent Application Publication No. 2011-081810 discloses an integrated touch polarizing plate and a touch panel including the integrated touch polarizing plate. This touch panel includes an integrated touch polarizing plate including a first conductive film having a conductive layer on an upper surface thereof, a first adhesive layer provided on the conductive layer, and a polarizing plate provided on the first adhesive layer.

Japanese Unexamined Patent Application Publication No. 2012-190087 discloses an input device and a method for manufacturing the input device. This input device has a light-transmitting transparent base member, a transparent electrode layer that is provided in an input region on one surface of the transparent base member, and a draw-out electrode that is provided in a non-input region around the input region so as to be electrically connected to the transparent electrode layer. In the method for manufacturing the input device, occurrence of an air bubble between a surface member and an optical adhesive layer is prevented by injecting a resin into a space between the transparent base member and the surface member that face each other.

SUMMARY OF THE INVENTION

In an input device that is a touch panel, a wiring pattern extends to an edge part of a base member of a touch sensor so that conduction with a light-transmitting electrode of the touch sensor is obtained. The wiring pattern has a terminal part at an end thereof, and an electrode layer of a flexible substrate is connected to this terminal part.

When such a flexible substrate is connected to the base member of the touch sensor, a connection region of the flexible substrate is held between the base member and an optical layer in some cases in order to obtain sufficient connection strength. In this case, the optical layer is located on the connection region of the flexible substrate connected to the base member. As a result, the optical layer has a step based on a thickness of the flexible substrate. Hereinafter, this step is also referred to as a step of the optical layer. This step of the optical layer creates a space between the optical layer and the base member, and this space is observed as an air bubble. This air bubble interferes depending on an optical angle and deforms the optical layer by expanding in volume under a high-temperature environment. This can be a cause of poor appearance.

In order to prevent occurrence of this space (air bubble), a resin is injected into the space in some cases. However, this requires a step of injecting the resin, thereby inviting an increase in the number of manufacturing steps. In other cases, although poor appearance is present due to the air bubble, a buffer region is provided between a region where the air bubble is located and an end of a detection region so that the air bubble does not affect the detection region where the light-transmitting electrode is disposed. In such cases, however, a large buffer region is needed in a case where the region where the air bubble is located is large. It is therefore difficult to meet recent demands for narrowing of a width of a region (where a draw-out wire is disposed) around the detection region. In view of this, making the region where the air bubble is located as narrow as possible is one of the most preferable measures from a perspective of prevention or reduction of various problems resulting from the air bubble.

The present invention provides an input device in which a region where an air bubble created between a sensor unit and an optical layer is present can be narrowed.

In order to solve the above problems, an input device according to an aspect of the present invention includes a sensor unit having a support base member, a light-transmitting electrode unit that is provided in a sensing region on a first surface of the support base member, and a terminal part that is conductive with the light-transmitting electrode unit and is provided outside the sensing region on the first surface of the support base member; an optical layer that is superimposed on the sensor unit in a first direction; and a flexible wiring substrate having a connection region that is connected to the terminal part and is held between the optical layer and the support base member.

In this input device, the flexible wiring substrate has a flexible base member on which an electrode layer is provided and a wiring end that is an end of the electrode layer and is connected to the terminal part so as to be conductive with the terminal part with use of a conductive joining member in the connection region. The wiring end is located at a position set back from an end of the flexible base member on a sensing region side, so that the flexible base member has a protruding part on which the electrode layer is not stacked and that protrudes toward the sensing region side beyond the wiring end. The input device has, on the sensing region side relative to a front end of the protruding part, a part into which the conductive joining member does not stick out.

According to this configuration, a step of the optical layer can be absorbed from the protruding part of the flexible base member toward the sensing region side in the part into which the conductive joining member does not stick out. This makes it possible to narrow a length of a region where an air bubble formed by the step of the optical layer is present.

The input device may be configured such that a height, from the first surface, of the conductive joining member that sticks out toward the sensing region side beyond the protruding part is equal to or lower than a height of the protruding part from the first surface. This makes it possible to absorb the step of the optical layer from the front end of the protruding part toward the sensing region side even in a case where a part of the conductive joining member protrudes beyond the protruding part of the flexible base member.

The input device may be configured to further include a protection layer provided between the light-transmitting electrode unit and the optical layer, wherein an adhesive layer that fixes the protection layer and the optical layer is located so as to reach an end of an outer periphery of a main surface of the protection layer. With this configuration, the air bubble is located on an outer side of the protection layer, and therefore a length of the air bubble region can be narrowed.

The input device may be configured such that a ratio of a thickness of the protection layer to the height of the protruding part from the first surface is 0.2 or more. A larger thickness of the protection layer leads to a smaller step of the optical layer and is therefore more preferable. That is, only from the perspective of reduction of the step, the ratio closer to 1 is more preferable, and as a result, the larger thickness of the protection layer is more preferable. However, a too large thickness of the protection layer decreases flexibility of the input device (touch panel). In view of this, the thickness of the protection layer is realistically approximately 15 μm at most and is preferably 10 μm or less.

The input device may be configured such that the protruding part is provided so as to become closer to the support base member in a protruding direction. With this configuration, the protruding part is gradually lowered toward the front end thereof (toward the sensing region side), and therefore a start point of absorption of the step of the optical layer can be set on an outer side as compared with a case where the protruding part is not lowered.

The input device may be configured such that the conductive joining member does not stick out toward the sensing region side beyond the front end of the protruding part when viewed in the first direction. With this configuration, a whole end of the flexible base member on the sensing region side is the protruding part, and it is therefore possible to effectively absorb the step of the optical layer.

The input device may be configured to further have a decorative layer that covers a peripheral region located outside the sensing region when viewed in the first direction. A region where the decorative layer is provided is an invisible region, and a region on an inner side of the invisible region is a visible region. The input device may be configured such that a surface member (a surface panel) is provided on an operation surface (a surface which an operating body such as a finger approaches) side.

DESCRIPTION OF THE PREFERRED EMBODIMENTS

An embodiment of the present invention is described below with reference to the drawings. In the following description, identical members are given identical reference signs, and description of members described once is omitted as appropriate.

Configuration of Input Device

Figure 1:
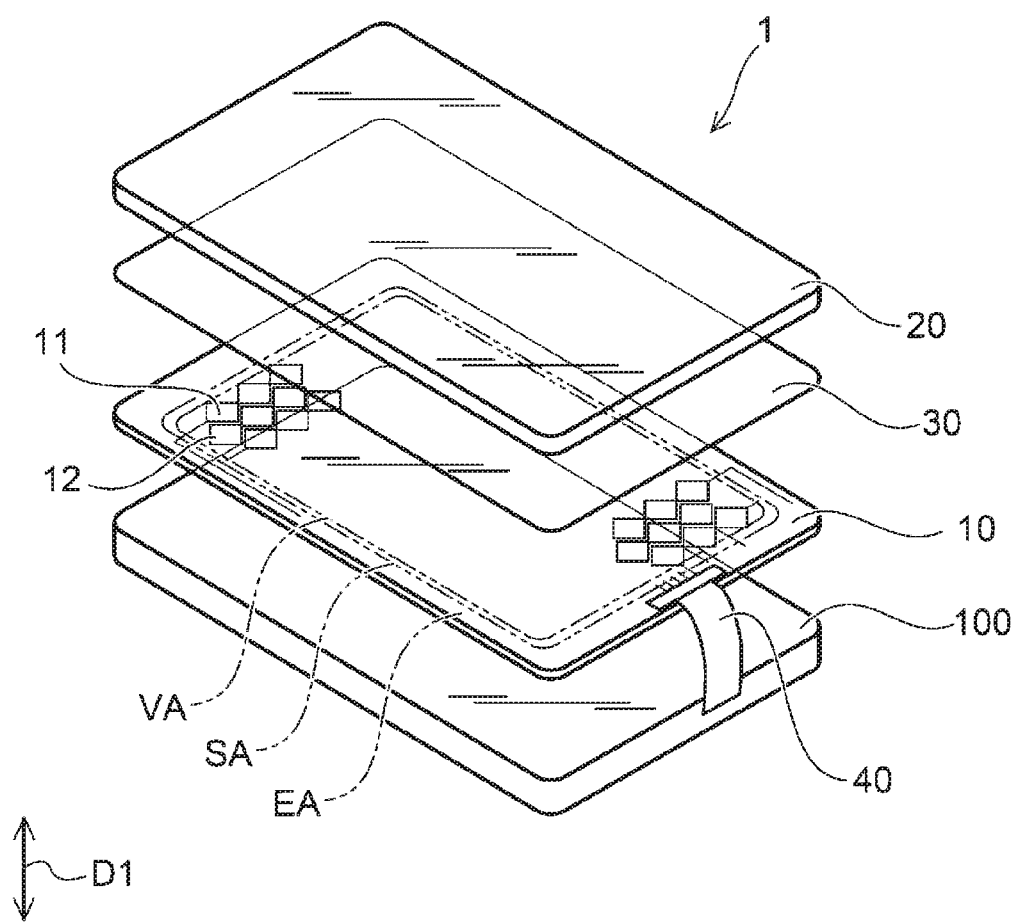
FIG. 1 is an exploded perspective view illustrating an input device according to the present embodiment.
Figure 2:
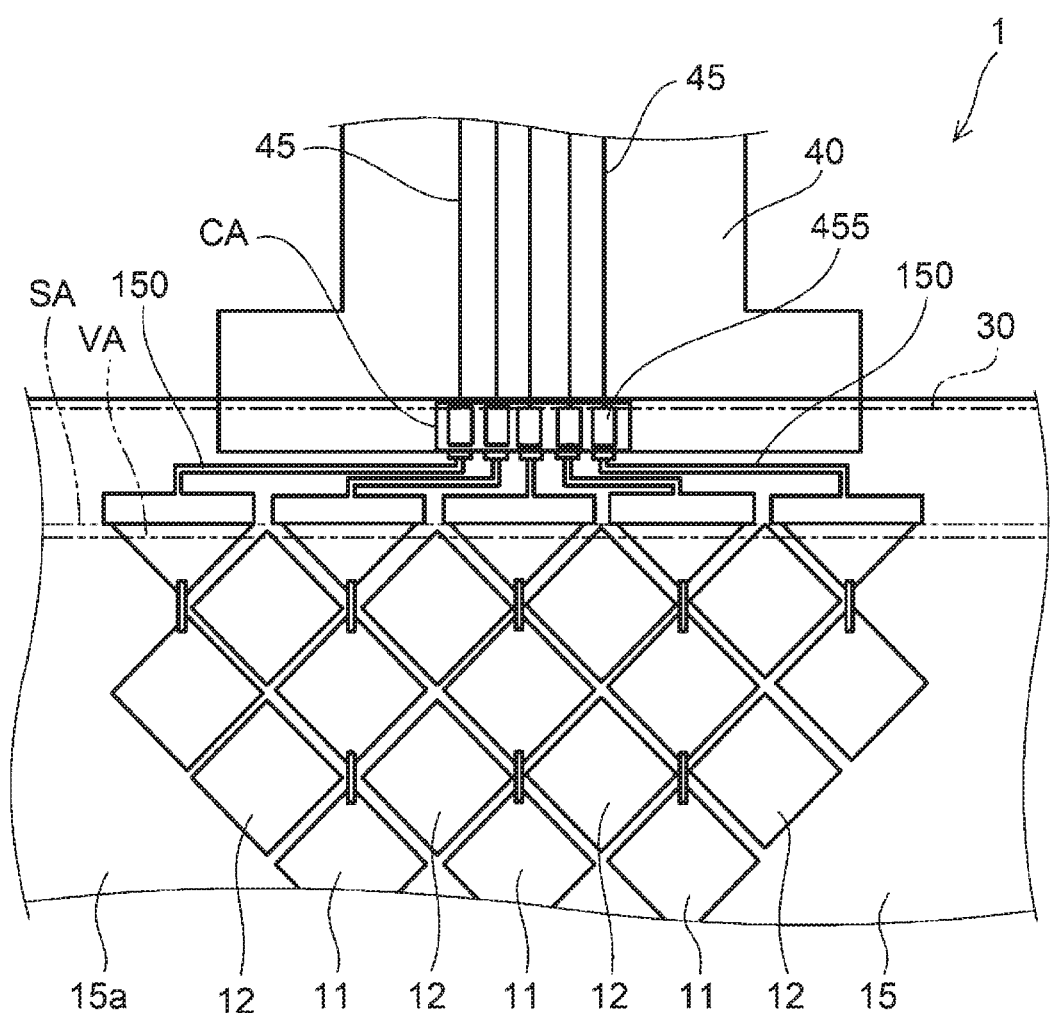
FIG. 2 is a plan view schematically illustrating the input device according to the present embodiment.
Figure 3:
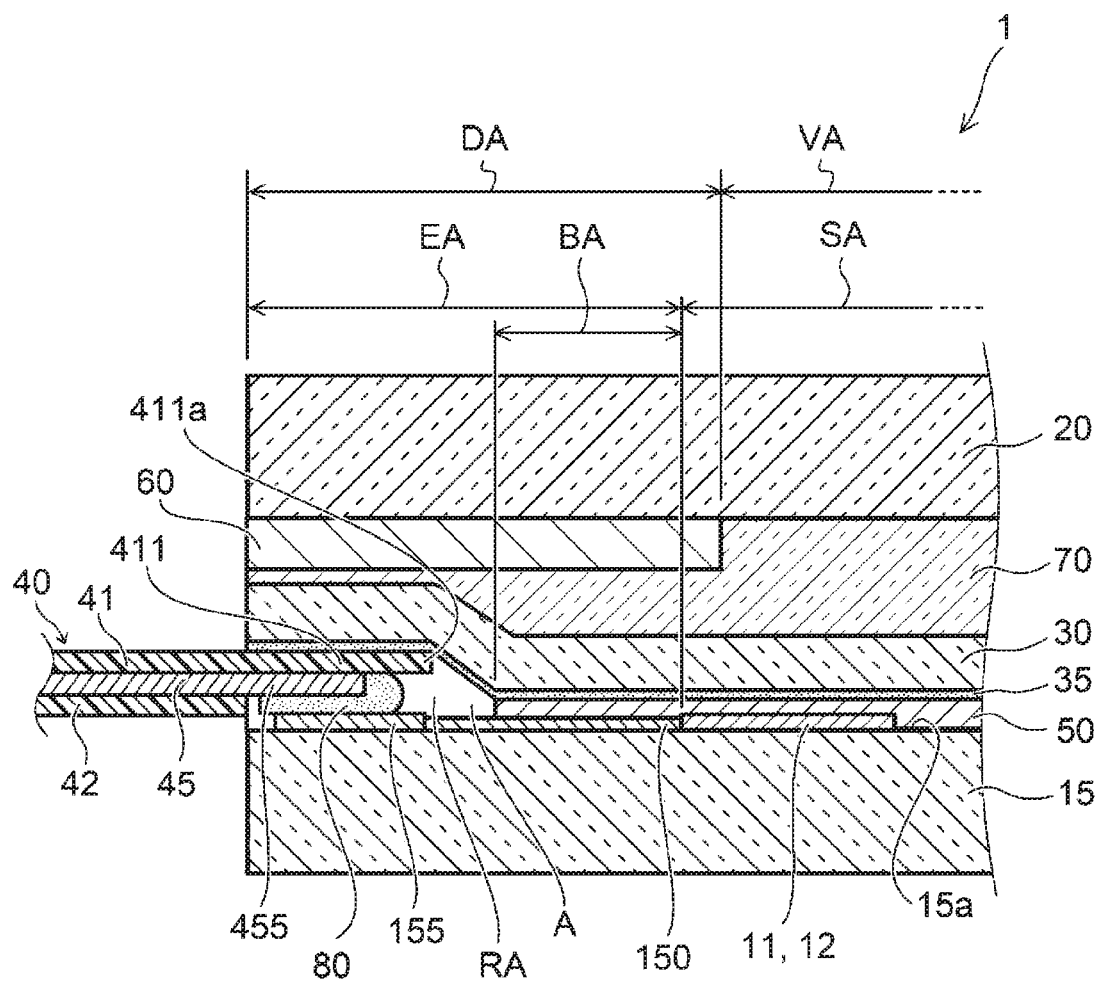
FIG. 3 is a cross-sectional view schematically illustrating the input device according to the present embodiment.

FIG. 1 is an exploded perspective view illustrating an input device according to the present embodiment. FIG. 2 is a plan view schematically illustrating the input device according to the present embodiment. More specifically, FIG. 2 is a plan view schematically illustrating a connection part of a flexible wiring substrate 40 in the input device 1. FIG. 3 is a cross-sectional view schematically illustrating the input device according to the present embodiment. More specifically, FIG. 3 is a cross-sectional view schematically illustrating the connection part of the flexible wiring substrate 40 in the input device 1. For convenience of description, a display device 100 is not illustrated in FIG. 3.

As illustrated in FIG. 1, the input device 1 according to the present embodiment includes a sensor unit 10 that is, for example, a capacitance type touch sensor, a surface panel (surface base member) 20 superimposed on the sensor unit 10 in a first direction D1, an optical layer 30 provided between the sensor unit 10 and the surface panel 20, and a flexible wiring substrate 40 connected to the sensor unit 10. The input device 1 is, for example, a touch panel. The input device 1 is attached onto the display device 100 such as a liquid crystal display device.

The sensor unit 10 detects a position on the basis of a change in electrostatic capacitance caused by approach of a finger or the like to a detection region of a sensing region SA. The sensor unit 10 includes a support base member 15, and a first electrode 11 and a second electrode 12 that are light-transmitting electrode units provided in the sensing region SA on a first surface 15a of the support base member 15. The support base member 15 is, for example, made of a light-transmitting flexible film such as polyethylene terephthalate (PET), cycloolefin polymer (COP), or cycloolefin copolymer (COC) or a light-transmitting hard plate member such as an acrylic resin or a polycarbonate resin (PC).

The first electrode 11 extends in one direction (e.g., an X direction) along a surface of the support base member 15, and the second electrode 12 extends in a direction (e.g., a Y direction) orthogonal to the one direction along the surface of the support base member 15. The first electrode 11 and the second electrode 12 are insulated from each other. In the present embodiment, a plurality of first electrodes 11 are disposed at predetermined intervals in the Y direction, and a plurality of second electrodes 12 are disposed at predetermined intervals in the X direction.

Although there are various kinds of electrode patterns that constitute the first electrode 11 and the second electrode 12, the first electrode 11 and the second electrode 12 each have a plurality of island-shaped electrodes in the present embodiment. Each of the island-shaped electrodes has, for example, a shape close to a rhombus.

The first electrode 11 and the second electrode 12 are provided so as to overlap the sensing region SA and therefore have light transmittance for transmitting an image displayed by the display device 100. For this reason, the first electrode 11 and the second electrode 12 are made of a light-transmitting conductive material (e.g., indium tin oxide (ITO), SnO2, ZnO, a conductive nanomaterial, or a metal material formed in a net shape).

On the support base member 15, a terminal part 155 is provided in a peripheral region EA on an outer side of the sensing region SA. A draw-out pattern 150 conductive with the first electrode 11 and the second electrode 12 extends in the peripheral region EA and is connected to the terminal part 155. The terminal part 155 is connected to a wiring end 455 in a connection region CA of the flexible wiring substrate 40.

A protection layer 50 is provided on the first electrode 11, the second electrode 12, and the draw-out pattern 150. The protection layer 50 is a cover film and is provided between (i) the first electrode 11, the second electrode 12, and the draw-out pattern 150 and (ii) the optical layer 30.

The surface panel 20 for protecting the sensor unit 10 is provided on the sensor unit 10 (on a side where the first electrode 11 and the second electrode 12 are provided). The surface panel 20 is a light-transmitting thin-plate-shaped member made of glass or plastic.

The optical layer 30 provided between the sensor unit 10 and the surface panel 20 is, for example, a polarizing plate, a ¼λ wave plate, or an optical adjustment base member in which the polarizing plate and the ¼λ wave plate are stacked. The optical layer 30 has a film shape. The optical layer 30 is preferably made of the same material as the support base member 15 (a light-transmitting flexible film such as polyethylene terephthalate (PET), cycloolefin polymer (COP), or cycloolefin copolymer (COC) or a light-transmitting hard plate member such as an acrylic resin or a polycarbonate resin (PC)). The optical layer 30 is attached onto the sensor unit 10 with use of an adhesive 35.

The connection region CA of the flexible wiring substrate 40 is held between, for example, an end of the optical layer 30 and the support base member 15. Since the connection region CA of the flexible wiring substrate 40 is held between the optical layer 30 and the support base member 15, load caused by application of stress onto the support base member 15 in a case where the flexible wiring substrate 40 is bent is lessened, and thereby breakage of the support base member 15 and peel of the flexible wiring substrate 40 are suppressed.

According to the configuration in which the connection region CA of the flexible wiring substrate 40 is held between the optical layer 30 and the support base member 15, an end of the film-shaped optical layer 30 is fixed so as to be located on the flexible wiring substrate 40. The optical layer 30 is attached onto the sensor unit 10 so as to absorb a step created by a thickness of the flexible wiring substrate 40. This step creates a space (an air bubble region A) between the optical layer 30 and the sensor unit 10 on a sensing region SA side relative to an end of the flexible wiring substrate 40.

The flexible wiring substrate 40 has a flexible base member 41 on which an electrode layer 45 is provided. The flexible base member 41 is a film base member having flexibility such as polyimide. The flexible wiring substrate 40 has a structure in which the electrode layer 45 is held between the flexible base member 41 on a front surface side and a flexible base member 42 on a rear surface side.

The wiring end 455 is an end of the electrode layer 45. The wiring end 455 is not covered with the flexible base member 42 on the rear surface side. The wiring end 455 is connected to the terminal part 155 so as to be conductive with the terminal part 155 with use of a conductive joining member 80 in the connection region CA. The conductive joining member 80 is an anisotropic conductive adhesive. Conduction between the wiring end 455 and the terminal part 155 can be obtained by holding the conductive joining member 80 between the wiring end 455 of the flexible wiring substrate 40 and the terminal part 155 of the support base member 15 and joining these members by pressure while applying heat.

An adhesive resin layer 70 is provided as an adhesive layer between the surface panel 20 and the optical layer 30. The adhesive resin layer 70 is made of a light-transmitting resin such as an optical clear adhesive (OCA). In the peripheral region EA, a decorative layer 60 is provided on a surface panel 20 side of the optical layer 30. The decorative layer 60 is, for example, provided on a rear surface of the surface panel 20. Since the peripheral region EA on an outer side of the sensing region SA is covered with the decorative layer 60, the draw-out pattern 150 and the flexible wiring substrate 40 can be prevented from being viewed. As illustrated in FIG. 3, an inner-side end of the decorative layer 60 may be provided on an inner side relative to an end of the peripheral region EA on a sensing region SA side from the perspective of more stably achieving invisibility of the draw-out pattern 150 provided in the peripheral region EA. In this case, as illustrated in FIG. 3, a region where the decorative layer 60 is provided is an invisible region DA and a visible region VA is present on an inner side of the invisible region DA when viewed in the direction D1.

Thicknesses of the respective constituent elements are described below but are not limited to these. A thickness of the flexible base member 41 is approximately 10 μm to 25 μm, preferably approximately 10 μm to 15 μm, a thickness of the electrode layer 45 is approximately 12 μm to 25 μm, typically approximately 20 μm, a thickness of the flexible base member 42 is approximately 30 μm, a thickness of the conductive joining member 80 is approximately 3 μm to 10 μm, a thickness of the optical layer 30 is approximately 150 μm, a thickness of the adhesive 35 is approximately 10 μm to 20 μm, and a thickness of the protection layer 50 is approximately 5 μm to 15 μm. Accordingly, the optical layer 30 is attached over a step of approximately 30 μm to 40 μm, and the air bubble region A is created in this step part.

In the input device 1, the wiring end 455 is located at a position set back from the end of the flexible base member 41 on the sensing region SA side. Accordingly, the flexible base member 41 has a protruding part 411 on which the electrode layer 45 is not stacked and that protrudes toward the sensing region SA side relative to the wiring end 455. In the present embodiment, a part RA into which the conductive joining member 80 does not stick out is present on the sensing region SA side relative to a front end 411a of the protruding part 411.

The presence of the part RA into which the conductive joining member 80 does not stick out makes it possible to effectively absorb the step of the optical layer 30 from the protruding part 411 of the flexible base member 41 toward the sensing region SA side. Specifically, the adhesive resin layer 70 that fixes the protection layer 50 and the optical layer 30 is located so as to reach an end of an outer periphery of a main surface of the protection layer 50, and the end of the outer periphery of the main surface of the protection layer 50 serves as an end of the air bubble region A on the sensing region SA side.

As a result, a length of the air bubble region A becomes narrow. This narrows a width of the peripheral region EA, thereby making it possible to widen the area of the sensing region SA. Narrowing the width of the peripheral region EA also narrows the width of the invisible region DA and therefore can widen the visible region VA. This makes it easy to meet a demand for a narrower frame (narrowing the width of the invisible region DA and widening the visible region VA to a position close to an end of the input device 1).

Figure 4:
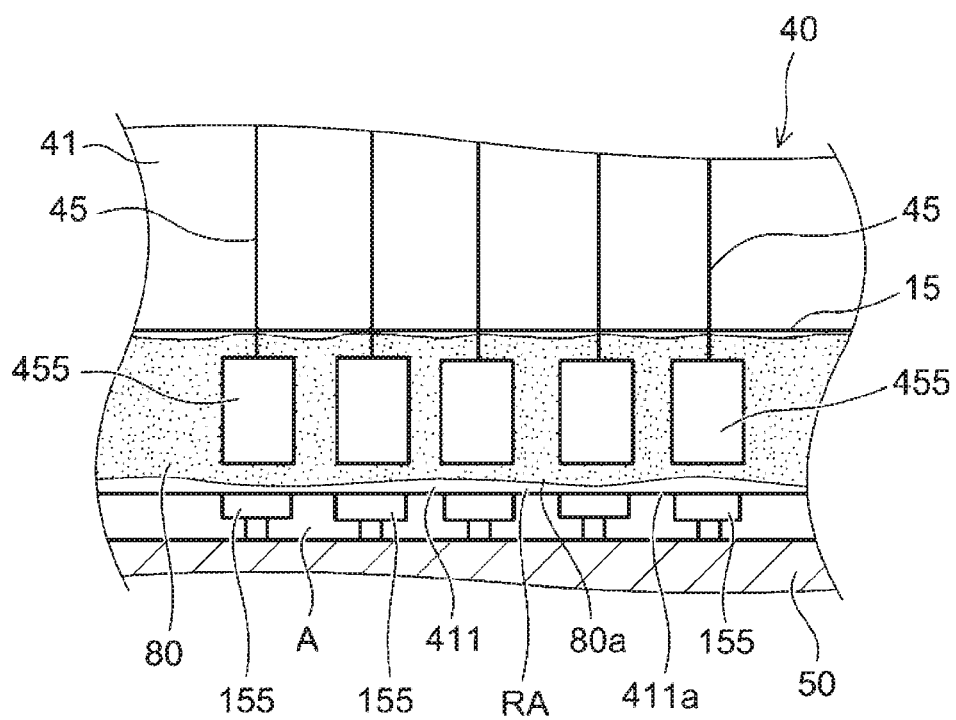
FIG. 4 is a plan view schematically illustrating a state of a part into which a conductive joining member does not stick out.

FIG. 4 is a plan view schematically illustrating a state of the part into which the conductive joining member does not stick out. More specifically, FIG. 4 is an enlarged plan view schematically illustrating a part where the wiring end 455 is provided.

In a case where the flexible wiring substrate 40 is connected, the conductive joining member 80 is held between the wiring end 455 and the terminal part 155, and conduction and adhesion are achieved by pressure joining while applying heat. In this pressure joining step, the conductive joining member 80 is squashed so as to spread.

The conductive joining member 80 that spreads to the sensing region SA side enters a space between the protruding part 411 of the flexible base member 41 and the terminal part 155. This space (a region between the protruding part 411 and the terminal part 155) is a region that can accommodate the conductive joining member 80. The conductive joining member 80 enters not only between the wiring end 455 and the terminal part 155 but also this space. This can heighten connection strength of the flexible wiring substrate 40.

Due to the presence of the region that can accommodate the conductive joining member 80, a front end 80a of the spread conductive joining member 80 on the sensing region SA side does not stick out beyond the front end 411a of the protruding part 411 of the flexible base member 41 on the sensing region SA side. This creates the part RA into which the conductive joining member 80 does not stick out to the sensing region SA side beyond the front end 411a of the protruding part 411.

Since the conductive joining member 80 does not stick out beyond the front end 411a of the protruding part 411, the length of the air bubble region A can be narrowed. Narrowing the length of the air bubble region A can shorten a length for absorption of the step of the optical layer 30 and can widen the sensing region SA accordingly. As illustrated in FIG. 3, a region having a predetermined length is provided between an outer-side end of the sensing region SA and an inner-side end of the air bubble region A. This region is a buffer region BA that prevent poor appearance resulting from an air bubble from affecting the sensing region SA even in a case where poor appearance occurs due to the air bubble. Narrowing the length of the air bubble region A can also narrow the length of the buffer region BA.

Figure 5A:
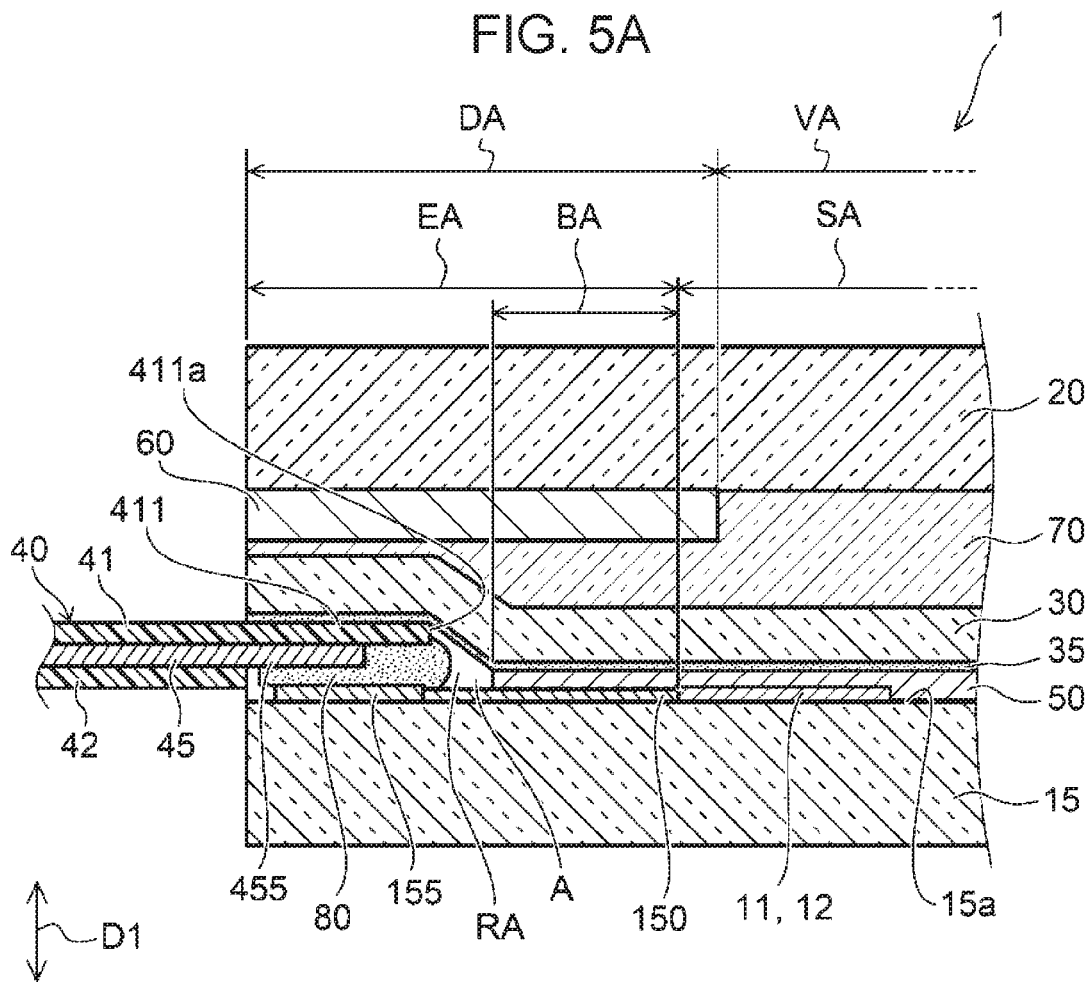
FIGS. 5A and 5A are cross-sectional views schematically illustrating another example.
Figure 5B:
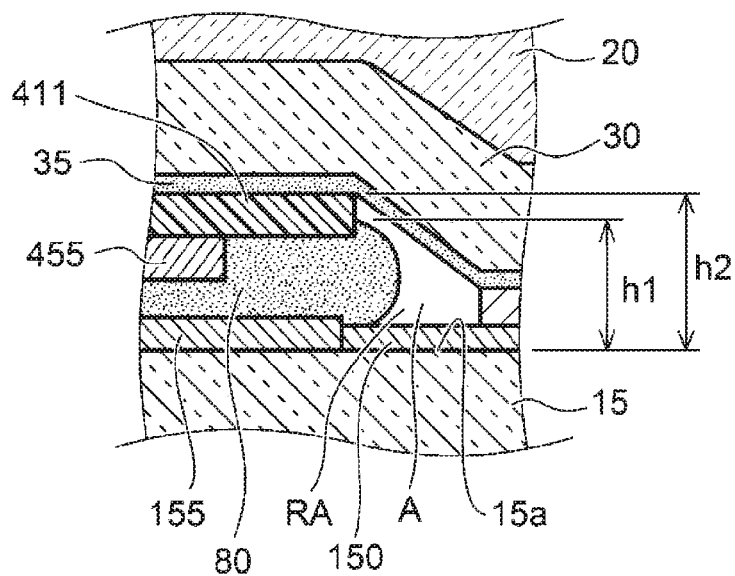
Figure 6:
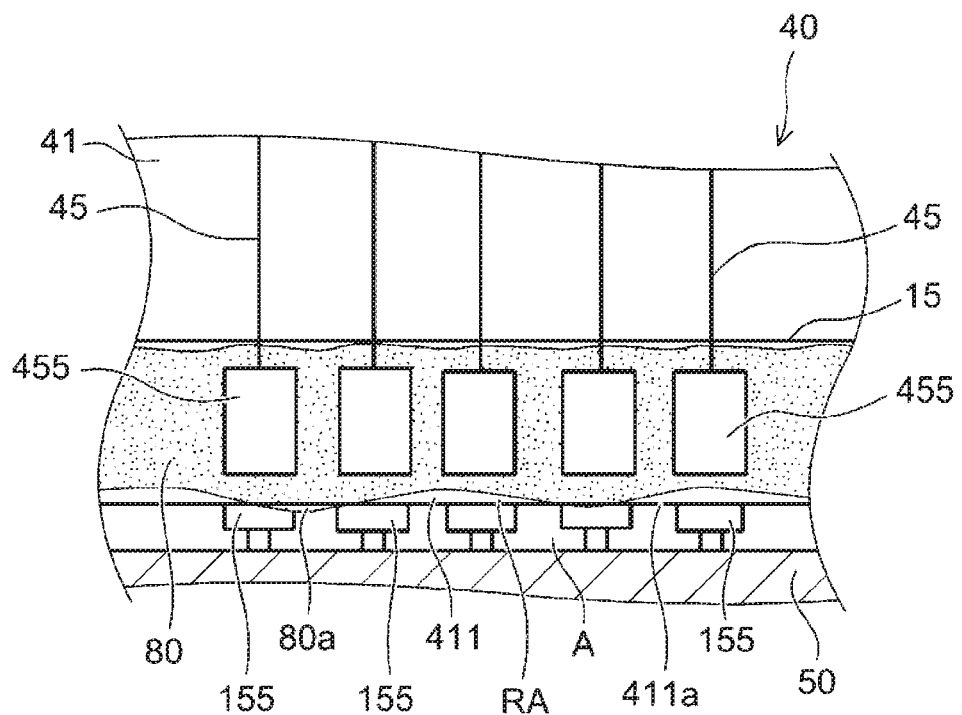
FIG. 6 is a plan view schematically illustrating another example of a state of a part into which the conductive joining member does not stick out.

FIGS. 5A and 5B are cross-sectional views schematically illustrating another example. FIG. 5A is a cross-sectional view schematically illustrating the connection part of the flexible wiring substrate 40 in the input device 1. For convenience of description, the display device 100 is not illustrated in FIG. 5A. FIG. 5B is an enlarged cross-sectional view schematically illustrating the protruding part 411 and surroundings thereof. FIG. 6 is a plan view schematically illustrating another example of a state of the part into which the conductive joining member does not stick out. More specifically, FIG. 6 is an enlarged plan view schematically illustrating a part where the wiring end 455 is provided.

In the aforementioned state of the part RA into which the conductive joining member 80 does not stick out, the part RA is provided throughout an entire region of the flexible base member 41 in the width direction. Meanwhile, in the other example illustrated in FIGS. 5 and 6, the part RA is provided over a part of the flexible base member 41 in the width direction.

The part RA into which the conductive joining member 80 does not stick out is preferably provided throughout the entire region of the flexible base member 41 in the width direction, but the effect of shortening the length of the air bubble region A can be obtained even in a case where the part RA is provided over a part of the flexible base member 41 in the width direction. In order to obtain the effect of shortening the length of the air bubble region A, it is only necessary that the part RA into which the conductive joining member 80 does not stick out be provided over approximately 80% or more of the flexible base member 41 in the width direction.

As illustrated in FIG. 5B, even in a case where the conductive joining member 80 sticks out toward the sensing region SA side beyond the protruding part 411 in a part of the flexible base member 41 in the width direction, a height h1 of a topmost position of a sticking-out part of the conductive joining member 80 from the first surface 15a is equal to or lower than a height h2 of an upper surface of the protruding part 411 from the first surface 15a. With this configuration, the part of the conductive joining member 80 that sticks out beyond the protruding part 411 of the flexible base member 41 does not make contact with the optical layer 30 and does not hinder absorption of the step of the optical layer 30. Even in a case where the conductive joining member 80 sticks out toward the sensing region SA side beyond the protruding part 411 throughout the entire region of the flexible base member 41, the part of the conductive joining member 80 that sticks out does not affect absorption of the step of the optical layer 30 and as a result it is possible to narrow the length of the air bubble region A in some cases as long as the height h1 of the part of the conductive joining member 80 that sticks out is lower than the height h2 of the upper surface of the protruding part 411.

A comparative example is described below.

Figure 7:
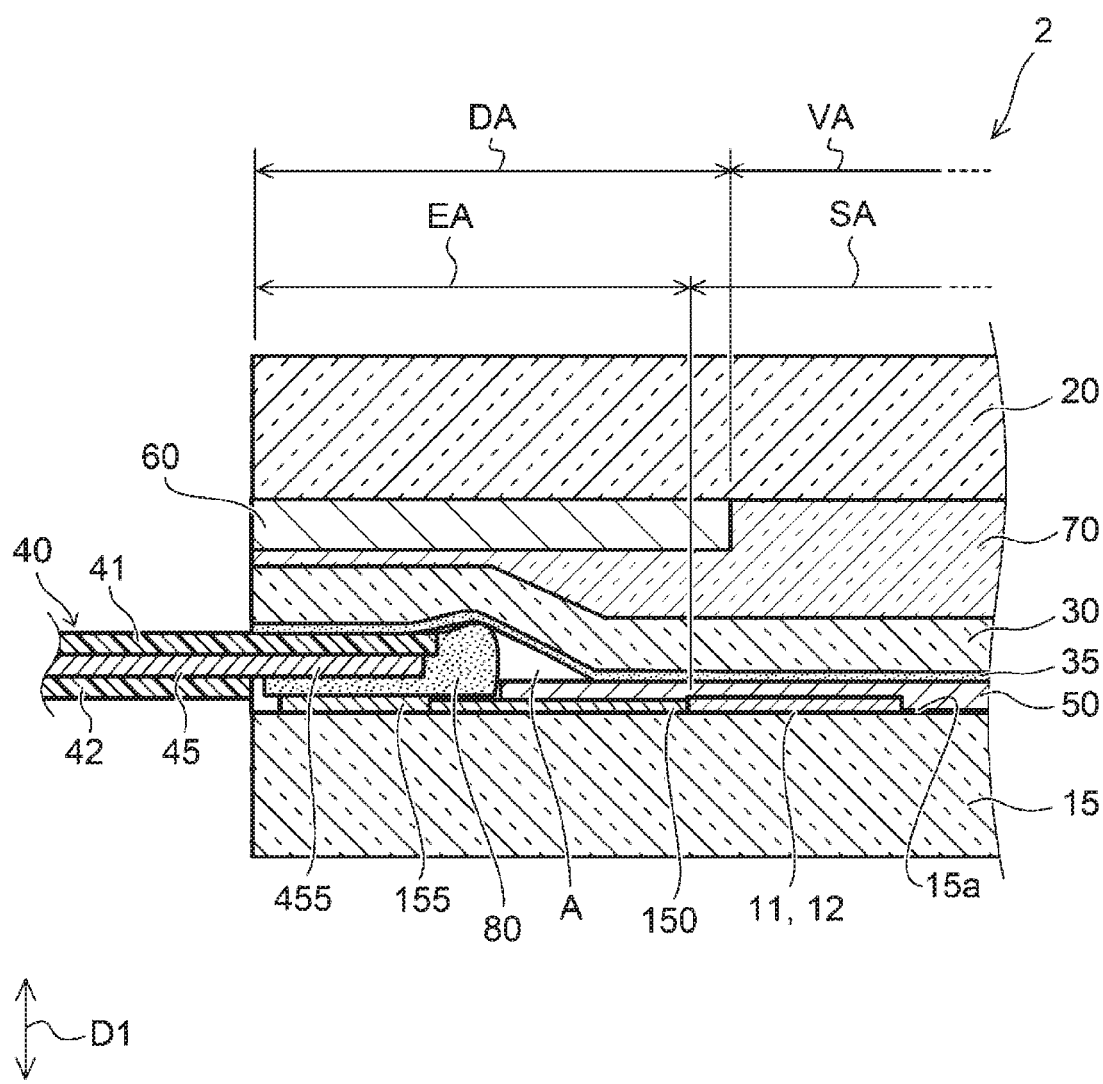
FIG. 7 is a cross-sectional view schematically illustrating a comparative example.
Figure 8:
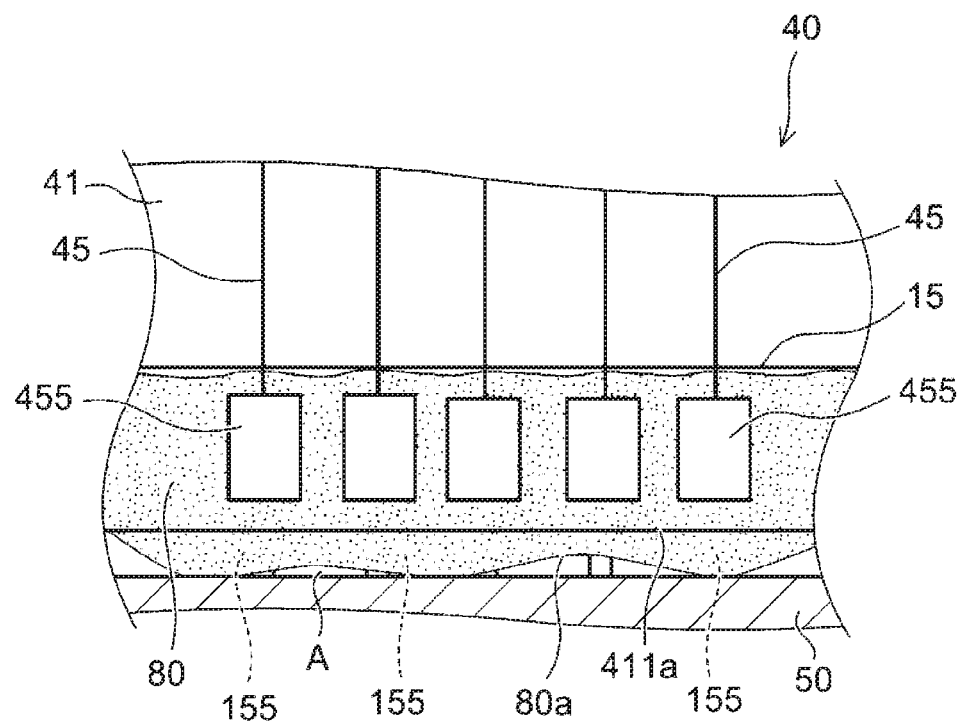
FIG. 8 is a plan view schematically illustrating a state in which the conductive joining member sticks out according to the comparative example.

FIG. 7 is a cross-sectional view schematically illustrating the comparative example. More specifically, FIG. 7 is a cross-sectional view schematically illustrating a connection part of the flexible wiring substrate 40 in an input device 2 according to the comparative example. For convenience of description, the display device 100 is not illustrated in FIG. 7. FIG. 8 is a plan view schematically illustrating an example of a state in which a conductive joining member sticks out in the comparative example. More specifically, FIG. 8 is an enlarged plan view schematically illustrating a part where the wiring end 455 is provided.

In the input device 2 according to the comparative example, the wiring end 455 of the flexible wiring substrate 40 is located at a position hardly set back from the end of the flexible base member 41 on the sensing region SA side.

Accordingly, the electrode layer 45 is provided so as to reach the sensing region SA side of the flexible base member 41, and therefore the region between the flexible base member 41 and the terminal part 155 cannot fully accommodate the conductive joining member 80.

Therefore, when the flexible wiring substrate 40 is connected, the conductive joining member 80 that spreads toward the sensing region SA side sticks out toward the sensing region SA side beyond the flexible base member 41 in a process for holding the conductive joining member 80 between the wiring end 455 and the terminal part 155 and joining these members by pressure while applying heat. Since the conductive joining member 80 sticks out, the part of the conductive joining member 80 that sticks out presses the optical layer 30. This prolongs a range of absorption of the step of the optical layer 30. Since the step absorption range needs to be set long, the sensing region SA is compressed accordingly. This hinders widening of the sensing region SA.

Meanwhile, in a case where the part RA into which the conductive joining member 80 does not stick out toward the sensing region SA beyond the front end 411a of the protruding part 411 as in the present embodiment, the range of absorption of the step of the optical layer 30 can be shortened, and the sensing region SA can be widened accordingly.

Figure 9:
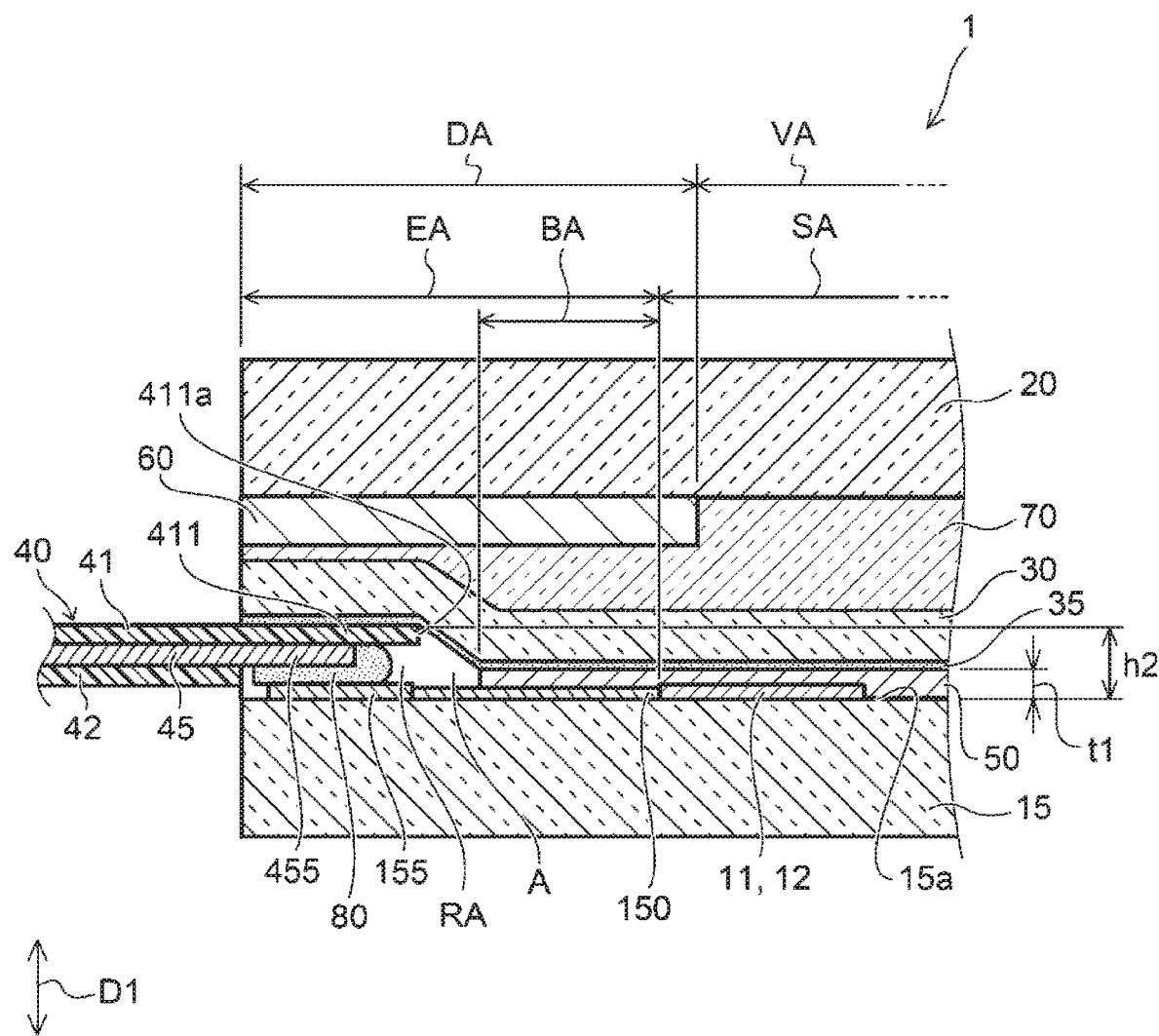
FIG. 9 is a schematic cross-sectional view for explaining a thickness of a protection layer.

FIG. 9 is a schematic cross-sectional view for explaining a thickness of the protection layer. More specifically, FIG. 9 is a cross-sectional view schematically illustrating the connection part of the flexible wiring substrate 40 in the input device 1. For convenience of description, the display device 100 is not illustrated in FIG. 9.

In the input device 1, a size of the step created by the flexible wiring substrate 40 can be adjusted by the thickness of the protection layer 50. For example, a ratio of a thickness t1 of the protection layer 50 to the height h2 of the upper surface of the protruding part 411 from the first surface 15a may be 0.2 or more. A larger thickness t1 of the protection layer 50 leads to a smaller step of the optical layer 30 and is therefore more preferable. That is, only from the perspective of reduction of the step, the ratio closer to 1 is more preferable, and as a result, the larger thickness t1 of the protection layer 50 is more preferable. However, a too large thickness of the protection layer 50 decreases flexibility of the input device 1. In view of this, the thickness t1 of the protection layer 50 is realistically approximately 15 μm at most and is preferably 10 μm or less.

Figure 10:
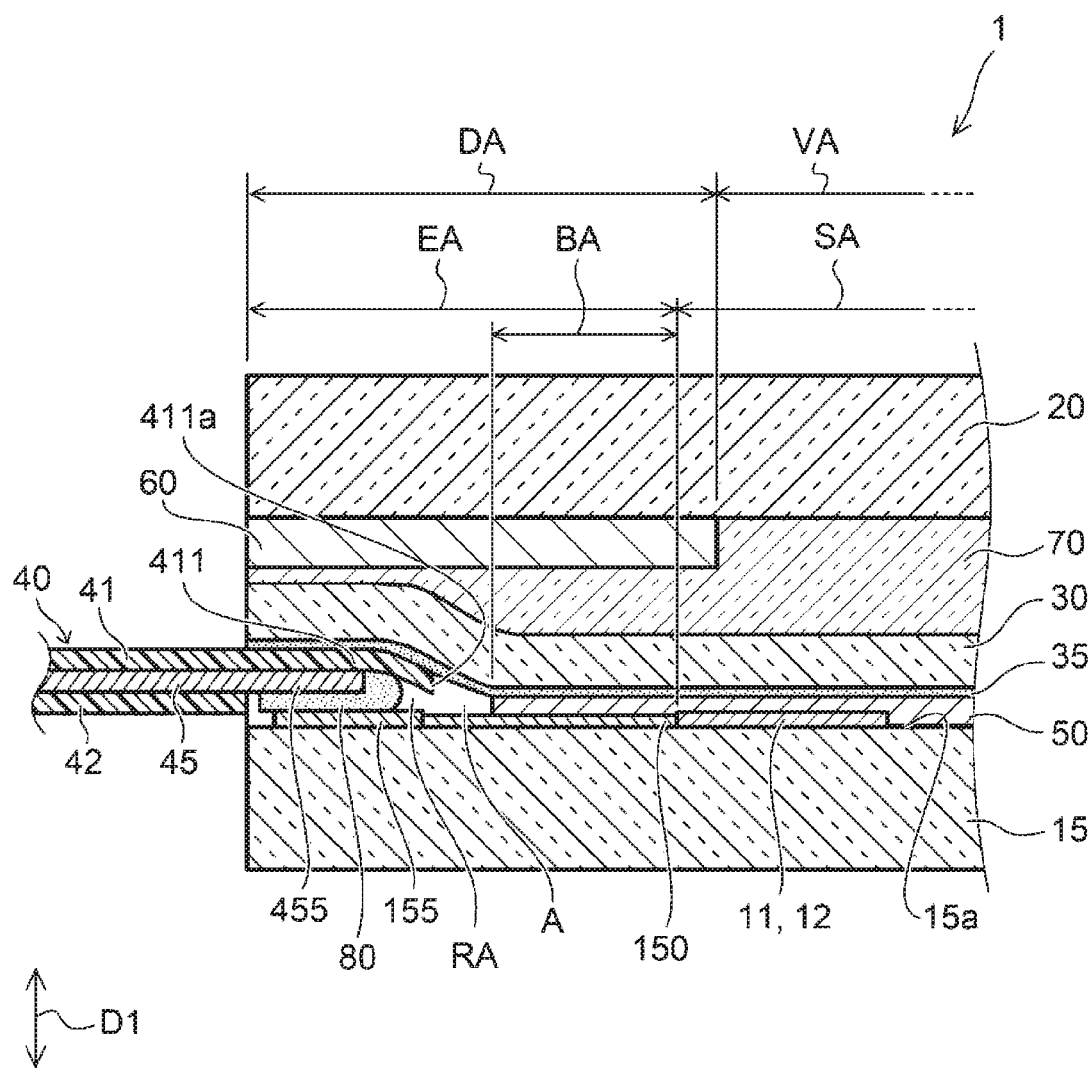
FIG. 10 is a cross-sectional view schematically illustrating another example of a protruding part.

FIG. 10 is a cross-sectional view schematically illustrating another example of the protruding part. More specifically, FIG. 10 is a cross-sectional view schematically illustrating the connection part of the flexible wiring substrate 40 in the input device 1. For convenience of description, the display device 100 is not illustrated in FIG. 10.

The protruding part 411 illustrated in FIG. 10 is provided so as to become closer to the support base member 15 side in a protruding direction. The flexible base member 41 is made of a resin material, such as polyimide, having flexibility. The electrode layer 45 and the flexible base member 42 on the rear side do not overlap the protruding part 411. Accordingly, the protruding part 411 can be provided so as to be gradually lowered toward a front end thereof (toward the sensing region SA side) due to flexibility of the flexible base member 41.

In the case where the protruding part 411 is gradually lowered toward the front end thereof, a start point of absorption of the step of the optical layer 30 can be set on an outer side (a side away from the sensing region SA) as compared with a case where the protruding part 411 is not lowered. This makes it possible to further shorten the length of the air bubble region A. As a result, it is possible to widen the sensing region SA.

As described above, according to the present embodiment, it is possible to provide the input device 1 in which the sensing region SA can be widened by narrowing the air bubble region A formed between the sensor unit 10 and the optical layer 30.

Although the present embodiment has been described above, the present invention is not limited to these examples. For example, appropriate addition, deletion, and design change of a constituent element in the above embodiment and an appropriate combination of features of the embodiment are also encompassed within the scope of the present invention without departing from the spirit of the present invention.

For example, although the surface panel 20 is located so as to cover the optical layer 30 in the input device 1, this configuration is not restrictive. The surface panel 20 may be located on the support base member 15 side of the sensor unit 10.

Although the input device 1 is configured such that the decorative layer 60 and the surface panel 20 are superimposed on a multilayer body in which the flexible wiring substrate 40 is held between the sensor unit 10 and the optical layer 30 in the above description, an input device according to an embodiment of the present invention may be configured not to have the decorative layer 60 and the surface panel 20. In this case, the input device includes the sensor unit 10, the optical layer 30 superimposed on the sensor unit 10, and the flexible wiring substrate 40 having the connection region CA held between the support base member 15 of the sensor unit 10 and the optical layer 30 and further includes the protection layer 50 on a side of the optical layer 30 that faces the sensor unit 10 as needed.

What is claimed is:

1. An input device comprising:
   a sensor unit including:
      a support base member having a sensing region on a first surface thereof;
      a light-transmitting electrode unit provided in the sensing region of the support base member; and
      a terminal part provided on the first surface of the support base member outside the sensing region, the terminal part being conductive with the light-transmitting electrode unit;
   an optical layer provided on the sensor unit in a first direction; and
   a flexible wiring substrate having a connection portion interposed between the optical layer and the support base member of the sensor unit, the flexible wiring substrate including:
      a flexible base member having a first end on a sensing region side; and
      an electrode layer provided on the flexible base member, the electrode layer having a wiring end portion in the connection portion, an edge of the wiring end portion being disposed at a position shifted from the first end of the flexible base member such that the flexible base member has an extending part which lacks the electrode layer thereon and extends toward the sensing region beyond the edge of the wiring end portion; and
   a conductive joining member disposed at least between the terminal part and the wiring end portion so as to conductively connect the wiring end portion to the terminal part, wherein at least part of the conductive joining member on the sensing region side does not protrude beyond an edge of the extending part toward the sensing region viewed from the first direction.

2. The input device according to claim 1, wherein a distance in the first direction between the first surface of the support base member and an upper surface of the conductive joining member protruding toward the sensing region beyond the edge of the extending part is equal to or smaller than a distance in the first direction between from the first surface of the support base member and an upper surface of the extending part.

3. The input device according to claim 1, further comprising:
   a protection layer provided between the light-transmitting electrode unit and the optical layer; and
   an adhesive layer which fixes the protection layer and the optical layer, the adhesive layer reaching an end of an outer periphery of a main surface of the protection layer.

4. The input device according to claim 3,
   wherein the protection layer has a thickness in the first direction, and
   wherein a ratio of the thickness of the protection layer to a distance in the first direction between an upper surface of the extending part and the first surface of the support base member is 0.2 or more.

5. The input device according to claim 1, wherein the extending part approaches the support base member as the extending part extends.

6. The input device according to claim 1, wherein the conductive joining member does not protrude toward the sensing region beyond an edge of the extending part of the flexible base member when viewed from the first direction.

7. The input device according to claim 1, wherein the conductive joining member is made of an anisotropic conductive adhesive.

8. The input device according to claim 1, wherein the conductive joining member is further disposed in at least part of a space formed between the terminal part of the sensor unit and the extending part of the flexile base member.

9. The input device according to claim 1, wherein a space between the terminal part of the sensor unit and the extending part of the flexible base member receives the conductive joining member protruding beyond the edge of the wiring end portion viewed from the first direction.

* * * * *